United States Patent
Komiak

(10) Patent No.: US 6,888,382 B2
(45) Date of Patent: May 3, 2005

(54) HIGH SPEED TRACK AND HOLD AMPLIFIER FOR DIRECT DIGITAL DOWN-CONVERSION

(75) Inventor: James J. Komiak, Merrimack, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 18 days.

(21) Appl. No.: 10/323,060

(22) Filed: Dec. 18, 2002

(65) Prior Publication Data

US 2004/0119508 A1 Jun. 24, 2004

(51) Int. Cl.[7] .............................................. G11C 27/02
(52) U.S. Cl. ......................................... 327/94; 327/309
(58) Field of Search ........................ 327/94, 560, 562, 327/306, 95; 330/252

(56) References Cited

U.S. PATENT DOCUMENTS

| | | | | |
|---|---|---|---|---|
| 4,513,323 A | * | 4/1985 | Patel | 358/197 |
| 5,491,450 A | * | 2/1996 | Helms et al. | 330/277 |
| 5,734,276 A | * | 3/1998 | Abdi et al. | 327/94 |
| 6,094,093 A | * | 7/2000 | Karanicolas | 327/560 |
| 6,114,911 A | * | 9/2000 | Iwai et al. | 330/295 |
| 6,489,814 B2 | * | 12/2002 | Hoogzaad et al. | 327/94 |

* cited by examiner

*Primary Examiner*—Dinh T. Le
(74) *Attorney, Agent, or Firm*—Daniel J. Long; Daniel J. Bourque

(57) ABSTRACT

An X-band capable track and hold amplifier capable of handling input frequencies of greater than 1 GHz, and as high as 15 GHz. The amplifier is built using a pseudomorphic high electron mobility transistor (PHEMT) process which gives high yield and uniformity.

15 Claims, 2 Drawing Sheets

HIGH SPEED TRACK AND HOLD AMPLIFIER FOR DIRECT DIGITAL DOWN-CONVERSION

TECHNICAL FIELD

The present invention relates to analog to digital conversion and more particularly, relates to a track and hold amplifier.

BACKGROUND INFORMATION

In the field of radar, radio and other signal transmission applications, it is often desirable to convert a signal from one frequency to a lower frequency. Typically, this has been done using multiple local oscillators with associated filters, mixers, intermediate frequency amplifiers and phase-locked loop circuitry. Such circuits consume power, are inherently lossy, and can emit spurious unwanted harmonic signals. These unwanted emissions can, with appropriate equipment, be detected and hence reduce the stealth capabilities of applications using such circuits. Additionally, a number of components associated with these local oscillators cannot readily be implemented in integrated circuits, requiring off-chip circuit elements such as crystals and inductors.

When utilizing field portable power sources, it is desirable that power consumption be minimized, and power be utilized efficiently. Reducing the circuit element count in a circuit can reduce power consumption, but utilizing traditional local oscillators and mixers for down-conversion has a practical limitation in traditional local oscillator-based designs.

A key element in enabling direct down-conversion of signals is a track and hold (T&H) amplifier to provide a steady sampled input to an analog to digital (A/D) converter. The current state of the art is capable of making A/D converters with resolutions for electronic warfare applications (EW) at eight bits at 1.5 GHz. Because of finite transition bands required by analog anti-aliasing filters, Nyquist criterion sampling (requiring a sampling rate of at least twice the frequency of the highest frequency in the signal to be sampled to avoid aliasing) limits signal bandwidth to about 500 MHz.

As a result, radio frequency (RF) components have still been required for amplification, frequency conversion and filtering. Such components generally consist of multiple tunable local oscillators mixers, filters and intermediate frequency (IF) amplifiers.

What is needed is an efficient (i.e. low circuit element count and power consumption) high speed (greater than 1 GHz) track and hold amplifier to be able to implement down-conversion, while minimizing spurious emissions to improve the stealth characteristics of the application.

SUMMARY OF THE INVENTION

The present invention addresses the problems associated with using local oscillators and other RF components by performing direct down-conversion using a novel combination of analog and digital circuitry to produce a track and hold amplifier (T&H) capable of handling input signals of greater than 1 GHz, and which can be used to provide an input to an A/D converter.

In one aspect, the invention relates to a high speed (i.e. greater than 1 GHz.) track and hold amplifier implemented using pseudomorphic high electron mobility transistors (PHEMT). In another aspect, the circuit is implemented using a 0.15 um double recess PHEMT process. In still another aspect, jitter and aperture time is improved by using a clock signal which has been squared up using a limiting amplifier.

In yet another aspect, the input signal to the T&H is balanced using a balun, and may also be buffered by a differential amplifier. Using balanced differential signals results in a rejection of common mode distortion such as clock feedthrough, correlated spurious or noise, and switching transients.

In another aspect, the invention is at least in part implemented as a monolithic microwave integrated circuit (MMIC), while in still another aspect, using pseudomorphic high electron mobility transistors (PHEMT).

An advantage of the present invention is that it may be implemented in a single monolithic integrated circuit without the need for local tunable oscillators and mixers. It is also an advantage in a wideband system that eliminating the need for local oscillators reduces the potential for in-band and near in-band re-radiation, improving stealth characteristics. Yet another advantage is a reduced number of circuit elements which reduces cost, size, weight and power consumption.

Another advantage of the present invention is that by being able to digitize a signal using the present invention as an input to an A/D converter closer to the antenna yields a performance advantage of wider bandwidth and higher dynamic range. Digital correction and calibration improves precision even further since there is less non-linearity and distortion for which to correct.

BRIEF DESCRIPTION OF THE DRAWINGS

These and other features and advantages of the present invention will be better understood by reading the following detailed description, taken together with the drawings wherein.

DETAILED DESCRIPTION OF THE PREFERRED EMBODIMENT

Direct down conversion of analog signals is of interest to radio, radar and other transmitting systems. Direct down conversion can provide size, power, weight and cost benefits compared to analog down conversion using local oscillators and mixers. Elimination of local oscillators reduces the potential for in-band and near in-band local oscillator re-radiation, which is desirable in stealthy applications.

An important element in high speed down conversion is the T&H amplifier. The T&H amplifier tracks an incoming analog signal, then samples and holds the sampled value of the signal for an aperture time so that an A/D converter has time to make the conversion. Current AID converters have limited signal input bandwidth that restricts their operation to the first or second sampling band. Using a high speed T&H amplifier with greater analog bandwidth in front of the AID converter will extend this bandwidth. Since information bandwidths are much less than the carrier frequency, the information is preserved by this bandpass sampling method. The A/D converter is clocked in accordance with Nyquist criteria for the information. The T/H amplifier is fast enough to follow and accurately hold the RE carrier value at the instant of clocking.

Such a T&H amplifier should also have appropriately short aperture time and low jitter to maintain the desired high speed performance level.

In an embodiment according to the principles of the invention, the T&H amplifier is implemented as a monolithic microwave integrated circuit (MMIC) using pseudomorphic high electron mobility transistors (PHEMT) fabricated using a 0.15 um double recess fully selective etch stop PHEMT process. This process has been found to be versatile, allowing the combination of low noise, power, passive switching and mixed signal devices on the same mask set. Furthermore, the process results in exceptional uniformity and high yield, which offers greater stability and threshold matching of the active components.

The MMIC was implemented on a 101.6 um thick substrate with slot vias and incorporated 25 ohms/square tantalum nitride (TaN) resistors and 400 pF/mm$^2$ metal-insulator-metal (MIM) silicon nitride (SiN) capacitors. This frees the design from constraints of using only active and differential topologies, coplanar transmission lines and large areas for grounding.

FET and diode based T&H amplifier configurations were selected for development because they are applicable to the PHEMT, a majority carrier device with a Schottky barrier gate diode. Variations included using either a FET switch or a diode bridge as a connection to a hold capacitor. Both differential amplifiers and source followers were used for pre-amplifiers and post-amplifiers.

A limiting amplifier was used to amplify and square up the input clock signal so as to increase the edge rate and minimize jitter.

Figure 1:
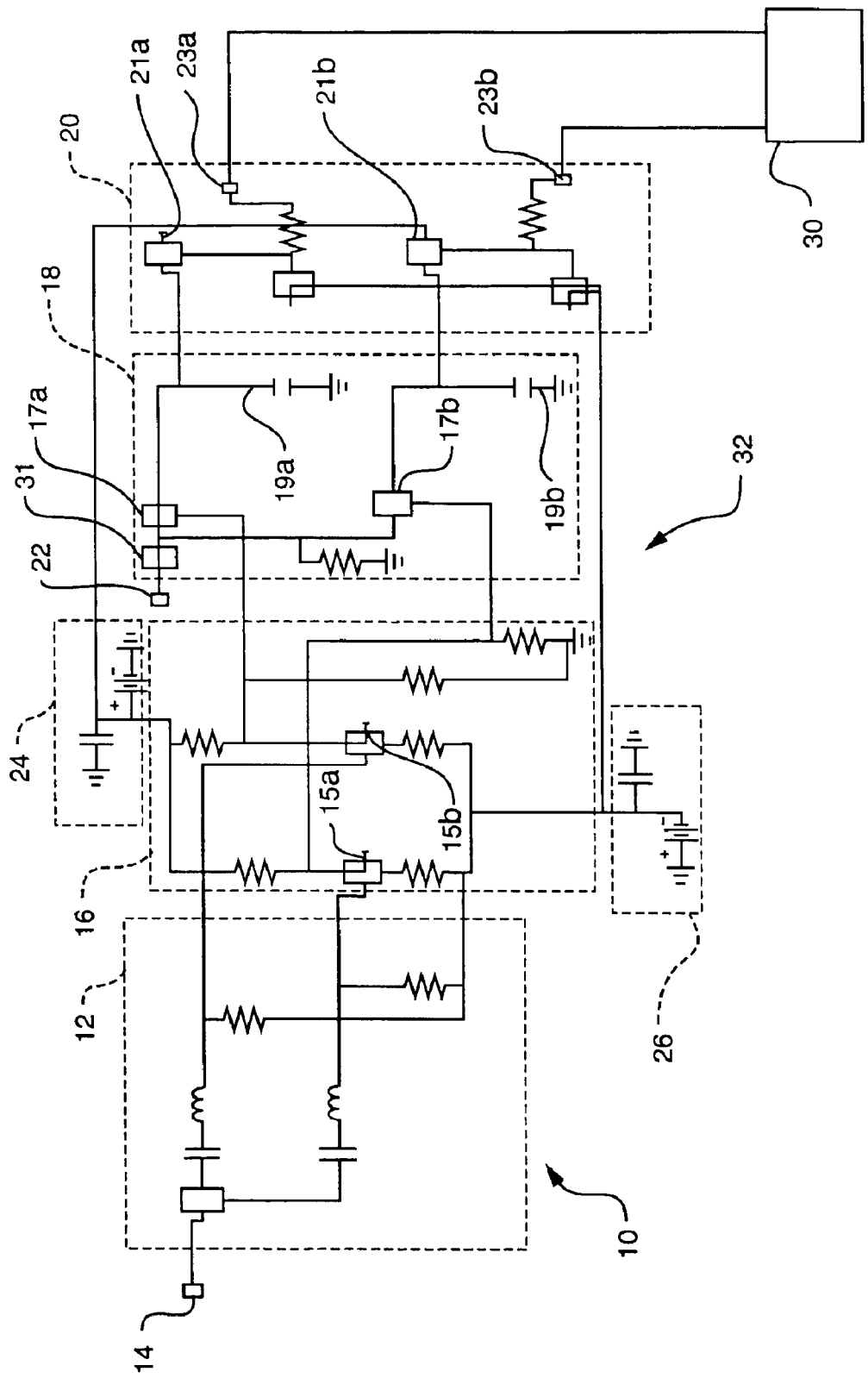
FIG. 1 is a block diagram of a T&H amplifier designed in accordance with the principles of the present invention.

Referring now to FIG. 1, an exemplary T&H amplifier 10 is shown designed in accordance with the principles of the present invention. The T&H amplifier 10 has four major building blocks: an input balancer 12 comprising a balun to balance the input signal; a buffering amplifier 16; a switched track and hold section 18 (which is also known as a control circuit 32) and an output buffer 20. Power is provided through plus and minus power sources 24 and 26.

An input 14 (referenced to ground) is balanced by the input balancer 12 section. Using a differential configuration throughout results in rejection of common mode signals such as clock feedthrough, switching transients and other noise sources. The balanced differential signal is fed to a differentially configured buffering amplifier section 16 producing a buffered differential output signal 15a and 15b.

The output 15a and 15b of the differential buffering amplifier section 16 is gated by a pair of passive field effect transistors 17a and 17b in the track and hold section 18, the gating being controlled by a clock input 22 as part of a control circuit 32. The clock input 22 may be shaped using a limiting amplifier 31 to square up the edges of the clock signal and increase the edge rate (while also reducing jitter.) Gates 17a and 17b either connect or isolate the differential buffer amplifier section 16 from the hold capacitors 19a and 19b.

A pair of source follower transistors 21a and 21b buffer the voltage present on the hold capacitors 19a and 19b and provided as a differential output at 23a and 23b for the analog-to-digital converter 30.

Figure 2:
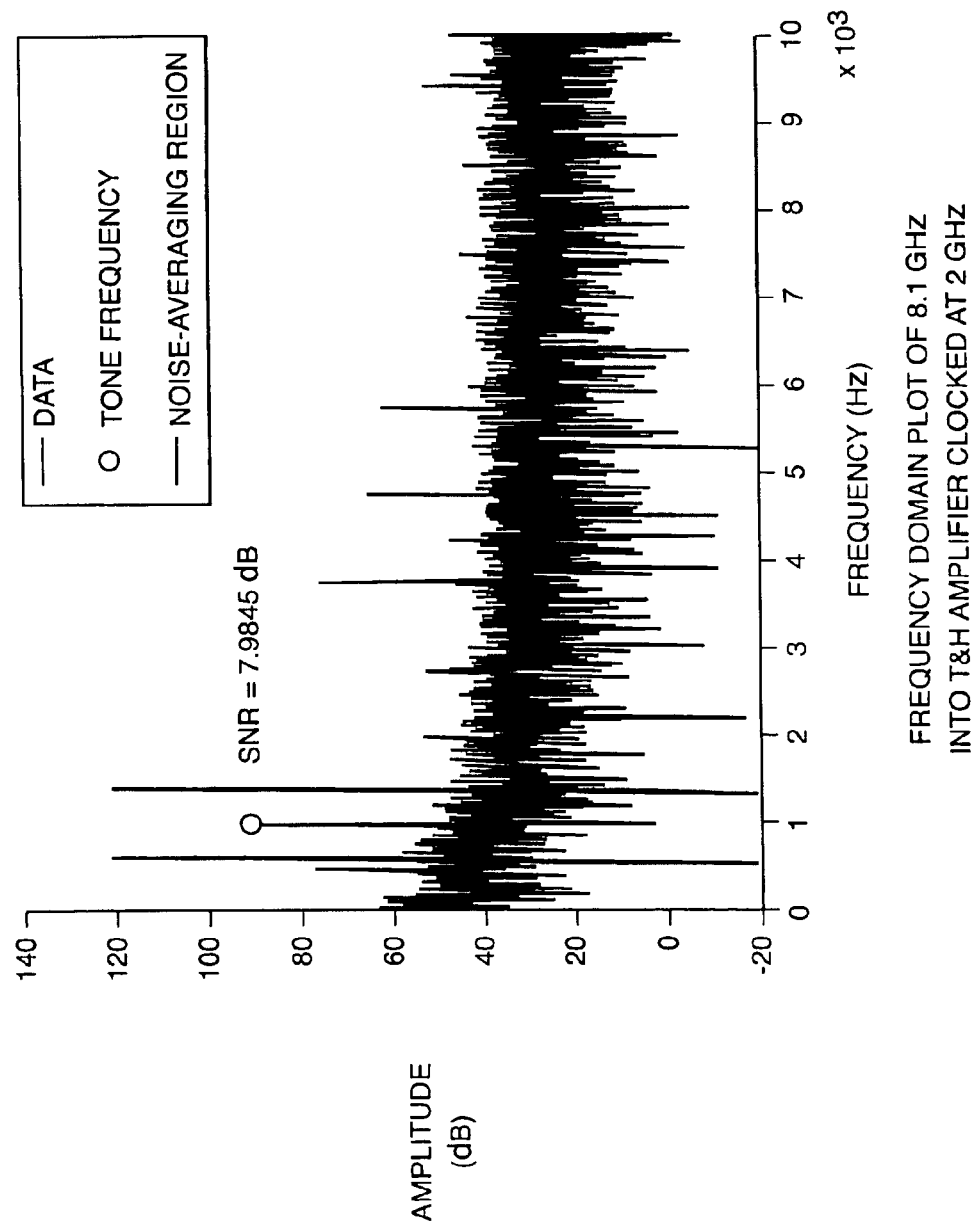
FIG. 2 is a frequency domain plot of an 8.1 GHz signal into a T&H amplifier built in accordance with the principles of the present invention.

FIG. 2 shows a frequency domain plot of amplitude vs. frequency, of an 8.1 GHz signal into a T&H amplifier built in accordance with the principles of the present invention, with the amplifier sampling at 2 GHz. This shows that a band RF carrier can be undersampled accurately to preserve the offset in frequency of 100 MHz.

An X-band input of 8.1 GHz was sampled at 2 GHz, the hold mode output was digitized, and a fast fourier transform (FFT) performed on the digital data. The aliased spectral line at 100 MHz 40 shows an 8 dB signal to noise ration and the peak spurious response is −16 dBc. This shows that modulations with bandwidths up to 1 GHz (fs/z) can be direct down-converted using bypass sampling implemented with a T/H amplifier.

Accordingly, the present invention provides a novel high speed track and hold amplifier implemented using pseudomorphic high electron mobility transistors (PHEMT) which results in significant improvements over the prior art.

Modifications and substitutions by one of ordinary skill in the art are considered to be within the scope of the present invention, which is not to be limited except by the following claims. For example, different specific circuit configurations could be utilized to implement the functions of the various sections.

What is claimed is:

1. A method comprising the acts of:
   in an electronic circuit, generating a differential input from a single-end, 50 ohm input using a passive transformer balun having an RF bandwidth of between 2 GHz and 12 GHz;
   applying said differential input to an input of a track and hold amplifier implemented using at least one PHEMT in a microchip circuit;
   using a clock pulse to cause an output of the track and hold amplifier to alternately track and hold the input signal of the track and hold amplifier; and
   providing the output of the track and hold amplifier to an analog to digital converter circuit.

2. The method of claim 1 wherein the microchip comprises a monolithic microwave integrated circuit.

3. The method of claim 1 wherein the clock pulse is an output from a limiting amplifier.

4. The method of claim 2 further including the act of fabricating the microchip circuit with a 0.15 um double recess PHEMT process.

5. The method of claim 1 wherein a buffer amplifier is disposed between the differential input and the output.

6. A circuit comprising:
   a track and hold amplifier having a differential input for receiving a microwave frequency signal and which is implemented in a monolithic microwave integrated circuit using at least one PHEMT;
   a passive transformer balun having an RF bandwidth of between 2 GHz and 12 GHz for generating a differential input from a single-ended, 50 ohm input; and
   a control circuit utilizing a clock pulse to enable an output of the track and hold amplifier to alternately track and hold said input to the track and hold amplifier.

7. The circuit of claim 6 wherein the microchip circuit is fabricated using a 0.15 um double recess PHEMT process.

8. The circuit of claim 7 wherein the clock pulse is an output from a limiting amplifier.

9. The circuit of claim 7 wherein the track and hold amplifier is able to track an input of said track and hold amplifier having a frequency greater than 1 GHz.

10. The circuit of claim 9 wherein the track and hold amplifier is able to track an input of said track and hold amplifier having frequency in the range of 1 GHz to 12 GHz.

11. The circuit of claim 6 wherein the track and hold amplifier further comprises a buffer amplifier between the differential input and the output.

12. A high frequency track and hold amplifier electronic circuit having a track and hold amplifier, wherein the circuit is at least partially implemented in a monolithic microwave integrated circuit using at least one PHEMT comprising:

a passive transformer balun having an RF bandwidth of between 2 GHz and 12 GHz to which a single-ended, 50 ohm unbalanced input signal is applied and from which a balanced signal may be taken;

a control circuit utilizing a clock pulse to enable an output of the track and hold amplifier to alternately track and hold a microwave frequency signal to an input signal to the track and hold amplifier, and wherein the clock pulse is taken from the output of a limiting amplifier; and wherein the track and hold amplifier tracks said balanced input signal having a microwave frequency in the range of 1 GHz to 12 GHz.

13. The circuit of claim 12 wherein the microwave circuit is fabricated using a 0.15 um double recess PHEMT process.

14. The circuit of claim 12 wherein the clock pulse is an output from a limiting amplifier.

15. The circuit of claim 12 wherein the track and hold amplifier further comprises a buffer amplifier between the differential input and the output.

* * * * *